(12) United States Patent  
Han et al.

(10) Patent No.: US 7,339,378 B2
(45) Date of Patent: Mar. 4, 2008

(54) TOROIDAL PROBE UNIT FOR NUCLEAR MAGNETIC RESONANCE

(75) Inventors: Oc Hee Han, Daegu (KR); Kee Sung Han, Gyeong Sang Buk-Do (KR)

(73) Assignee: Korea Basic Science Institute, Dae Jeon Gwang Yeok-Shi (KR)

( * ) Notice: Subject to any disclaimer, the term of this patent is extended or adjusted under 35 U.S.C. 154(b) by 0 days.

(21) Appl. No.: 11/510,233

(22) Filed: Aug. 25, 2006

(65) Prior Publication Data

US 2007/0205768 A1 Sep. 6, 2007

(30) Foreign Application Priority Data

Mar. 2, 2006 (KR) ........................ 10-2006-0020083

(51) Int. Cl.
*G01V 3/00* (2006.01)

(52) U.S. Cl. ........................................ 324/321; 324/318

(58) Field of Classification Search ................ 324/318, 324/321, 322; 600/410, 419, 422; 343/873, 343/872

See application file for complete search history.

(56) References Cited

U.S. PATENT DOCUMENTS

| | | | |
|---|---|---|---|
| 5,045,793 A | | 9/1991 | Rathke |
| 5,574,370 A | | 11/1996 | Woelk et al. |
| 6,046,592 A | | 4/2000 | Rathke et al. |
| 6,191,583 B1 | | 2/2001 | Gerald, II et al. |
| 6,469,507 B1 | * | 10/2002 | Gerald et al. ................ 324/318 |
| 6,674,283 B2 | * | 1/2004 | Gerald et al. ................ 324/318 |
| 6,788,064 B2 | * | 9/2004 | Gerald et al. ................ 324/322 |
| 6,791,326 B2 | | 9/2004 | Gerald, II et al. |
| 7,205,768 B2 | * | 4/2007 | Schulz et al. ................ 324/322 |
| 7,248,049 B2 | * | 7/2007 | Volke et al. ................ 324/321 |
| 7,268,552 B1 | * | 9/2007 | Gerald et al. ................ 324/318 |
| 7,271,592 B1 | * | 9/2007 | Gerald et al. ................ 324/321 |
| 2003/0016019 A1 | * | 1/2003 | Gerald et al. ................ 324/322 |
| 2003/0173967 A1 | * | 9/2003 | Gerald et al. ................ 324/322 |
| 2005/0218897 A1 | * | 10/2005 | Schulz et al. ................ 324/322 |
| 2006/0012368 A1 | * | 1/2006 | Volke et al. ................ 324/318 |
| 2007/0205768 A1 | * | 9/2007 | Han et al. ................ 324/318 |

OTHER PUBLICATIONS

R. E. Gerald, II et al., "In situ Nuclear Magnetic Resonance Investigations of Lithium ions in Carbon Electrode Materials using a novel Detector", J. Physc.: Condens. Matter 13; (2001); pp. 8269-8285.

* cited by examiner

*Primary Examiner*—Bruj Shrivastav
*Assistant Examiner*—Tiffany A. Fetzner
(74) *Attorney, Agent, or Firm*—Keusey, Tutunjian & Bitetto, P.C.

(57) ABSTRACT

Disclosed is a probe unit for nuclear magnetic resonance. The probe unit includes a cylindrical outer conductor, a cylindrical central conductor concentrically disposed in the outer conductor, a membrane assembly and fluid paths guiding the flow of fluid in the space between the central and outer conductors. By applying a RF current between the outer and central conductors, a sensing magnetic field is generated in a radial direction. Accordingly, it is possible to detect in real time and in situ, variations of characteristics as well as spatial distribution changes, of a fluid under reaction and/or passing through the fluid paths in the space between the central and outer conductors.

11 Claims, 5 Drawing Sheets

TOROIDAL PROBE UNIT FOR NUCLEAR MAGNETIC RESONANCE

CROSS-REFERENCE TO RELATED APPLICATIONS

This U.S. non-provisional patent application claims priority under 35 U.S.C. § 119 from Korean Patent Application No. 10-2006-0020083 filed on Mar. 2, 2006, the entire contents of which are incorporated herein by reference.

BACKGROUND

The present invention disclosed herein relates to probe units for nuclear magnetic resonance. In particular, the present invention relates to a probe unit for nuclear magnetic resonance, using toroid cavity.

A probe coil used for nuclear magnetic resonance (NMR) generates a sensing magnetic field ($B_1$) of radio frequency (RF) therein. When the frequency thereof matches with a specific nuclear spin resonance frequency of a sample, RF energy is absorbed into the nuclear spins of the sample. Then, the probe coil detects a variation of inductive magnetization during relaxation of the nuclear spins excited by the RF energy.

The probe coil is generally classified into various kinds widely used for nuclear magnetic resonance, e.g., solenoid coil, saddle coil, Helmholtz coil, and toroid cavity. Toroid cavity can produce a series of spatially resolved NMR spectra of a sample as a function of radial distance from a central conductor. In electrochemical applications, the central conductor may function as a working electrode as well as part of a RF coil.

However, according to conventional technology, the measurement of various properties is possible only for a stationary sample contained in a probe unit without being continuously supplied thereto or discharged therefrom. Thus, it is hard to detect in real time and in situ, spatially resolved variations of characteristics of a fluid (liquid or gas) sample in a system requiring continuous supply and discharge of fluid.

SUMMARY OF THE INVENTION

For purposes of solving the aforementioned problems, the present invention is directed to a probe unit for NMR, capable of detecting variations of properties as well as spatial distribution of fluid(s) in situ and in real time.

The present invention provides a probe unit for nuclear magnetic resonance. The toroid cavity includes flow paths through which gas or liquid flows. The probe unit comprises a cylindrical outer conductor including an opening at one end to a central axis, and a hollow inside; a central conductor placed concentrically in the outer conductor; a membrane assembly disposed adhesively to the central conductor, between the outer and central conductors; a first flow path, guiding a flow of fluid, extending from one end of the conductor toward the other end along the central axis, adjacent to the membrane assembly; and a cap connecting the ends of the central and the outer conductor. A sensing magnetic field is generated by applying a RF current between the outer and central conductors.

The central conductor may further comprise a first furrow extending from one end of the outer surface of the conductor toward the other end along the central axis. In this embodiment, the first furrow constitutes the first flow path in a space formed by the membrane assembly and the first furrow.

The probe unit may further comprise a tube including a second furrow on the inner surface of the tube at a position matching with the first furrow, being disposed adhesively to an outer surface of the membrane assembly.

The membrane assembly for an electrochemical cell comprises an electrolyte membrane, anode and cathode electrodes that are attached to inner and outer surfaces of the membrane, respectively. The electrodes are made of a carbon cloth and metallic catalysts coated on the surface of the carbon cloth.

Methanol and oxygen gas may flow through the first and second fluid path, respectively, in the application of the probe for a methanol direct fuel cell.

The probe unit further comprises a current collector that is disposed between bottom ends of the central and the outer conductors, and connected to the outer electrode of the membrane assembly.

A further understanding of the nature and advantages of the present invention herein may be achieved by referring to the remaining portions of the specification and the attached drawings.

BRIEF DESCRIPTION OF THE FIGURES

Non-limiting and non-exhaustive embodiments of the present invention will be described with reference to the following figures, wherein like reference numerals refer to like parts throughout the various figures unless otherwise specified.

DETAILED DESCRIPTION OF PREFERRED EMBODIMENTS

Figure 1:
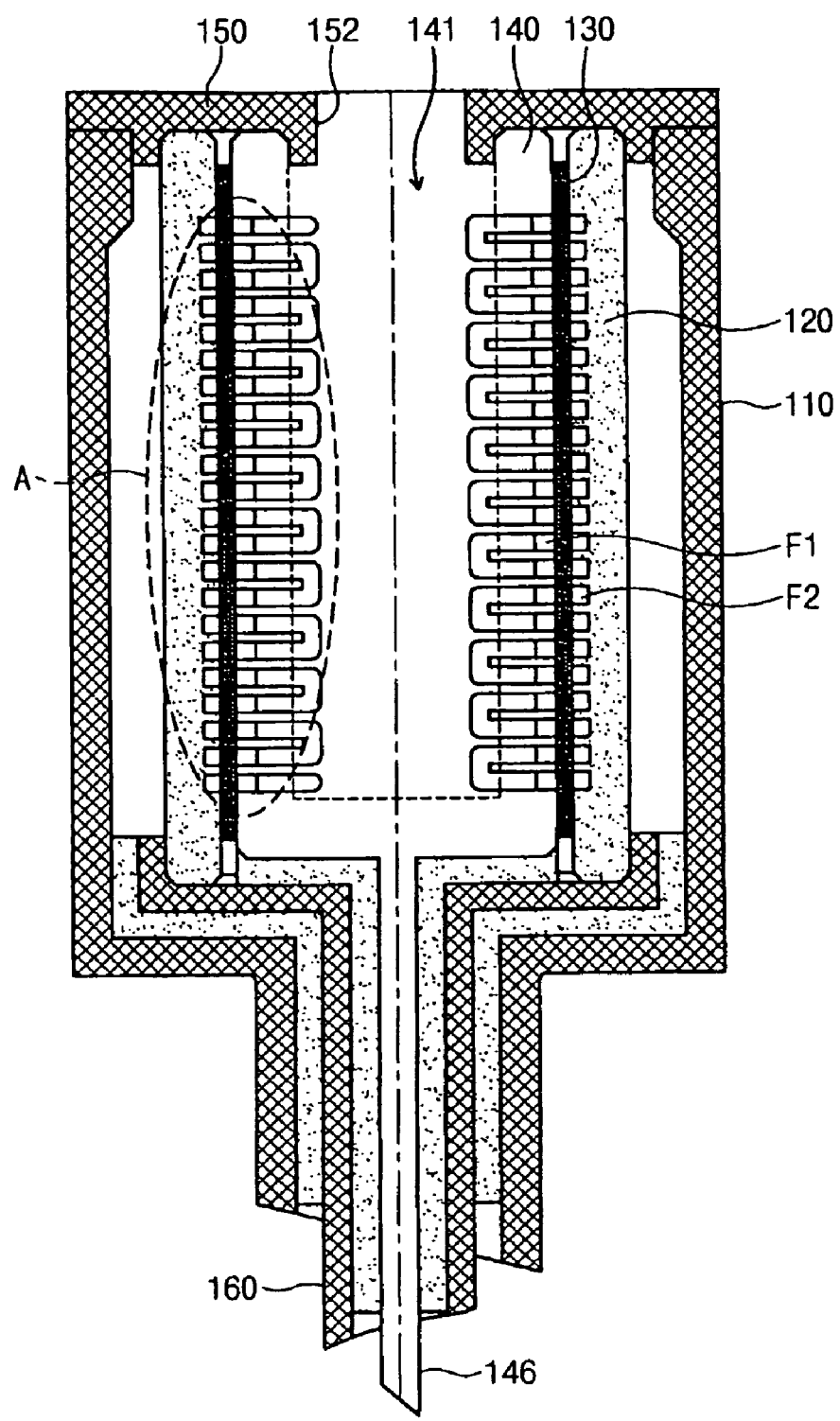
FIG. 1 is a sectional view illustrating a probe unit according to the present invention.

Preferred embodiments of the present invention will be described below in more detail with the accompanying drawings. The present invention may, however, be embodied in different forms and should not be constructed as limited to the embodiments herein. Rather, these embodiments are provided so that this disclosure will be thorough and complete, and will fully convey the scope of the present invention to those skilled in the technology. In the figures, the dimensions of elements are exaggerated for clarity of illustration. Like reference numerals refer to like elements throughout.

Figure 2:
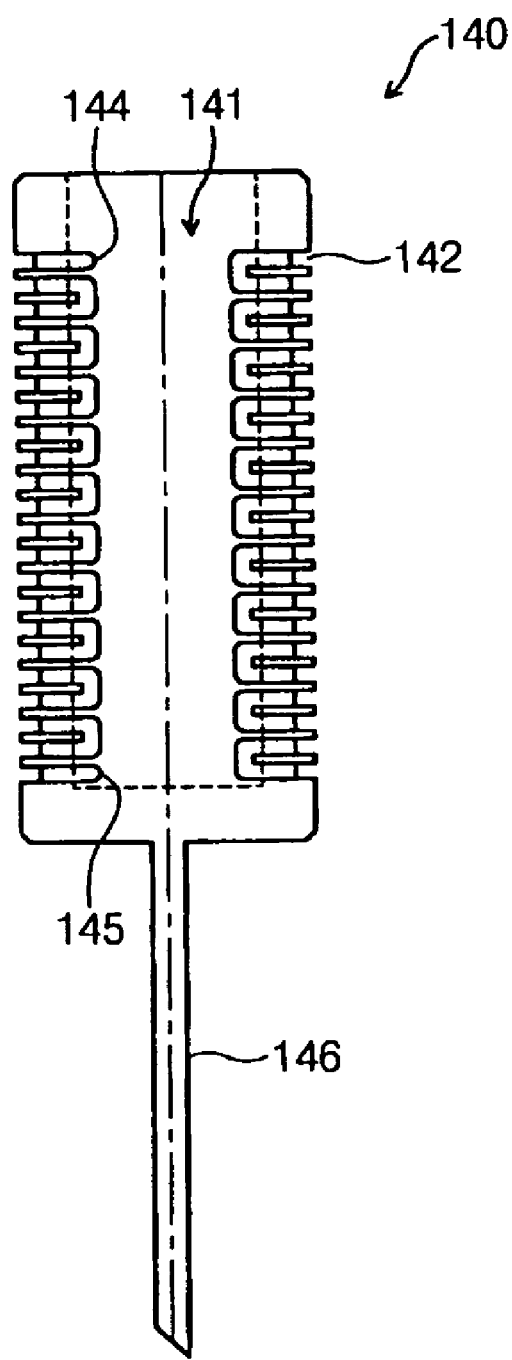
FIG. 2 is a sectional view illustrating a central conductor according to the present invention.
Figure 3:
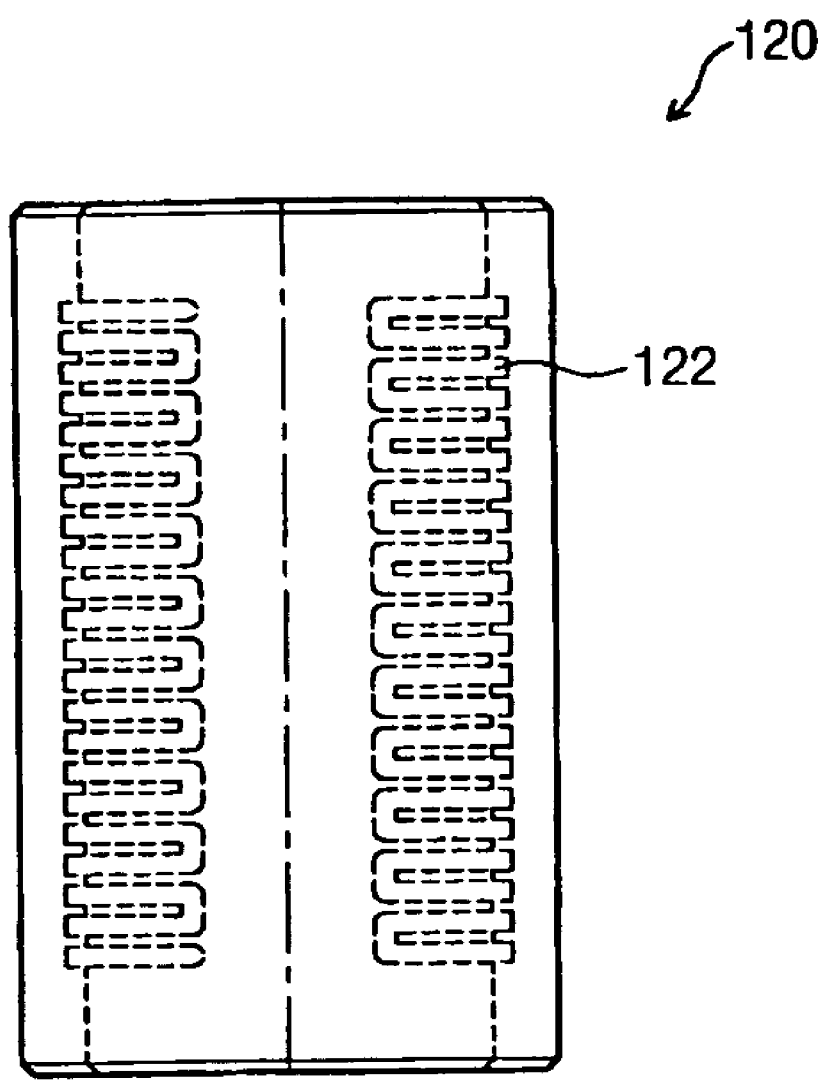
FIG. 3 is a sectional view illustrating a tube according to the present invention.

FIGS. 1, 2, and 3 are sectional views illustrating a probe unit 100, a central conductor 140, and a tube 120 according to the present invention, respectively.

Referring to FIGS. 1 and 2, the probe unit 100 is comprised of a cylindrical outer conductor 110 that has a hollow inside and an opening at one end to the direction of a central axis, a central conductor 140 concentrically placed in the outer conductor 110, a membrane assembly 130 interposed between the outer conductor and the central conductor, and a cap covering the open ends of the central and outer conductors simultaneously. The outer conductor is in a shape of two tubings with different diameters concentrically attached end to end.

The central conductor 140 is comprised of a first furrow 142 on the outer surface of the conductor extending from one end toward the other end along the central axis, guiding a fluid flow through the first furrow. The central conductor 140 may be built in a cylinder shape with one open end and the other end closed. The central conductor 140 includes a hollow 141 extending from the open end and has an inlet unit 144 for supplying the fluid, and an outlet unit 145 for exhausting the fluid. Supplying and exhausting fluid may pass through the hollow of the central conductor. A cap/cover 150 is placed to close the hollow 141 and to cover the open ends of the central and outer conductor simultaneously and to connect them electrically. Alternatively, the cover 150 may include an opening 152 to open the hollow 141 while the cover 150 still keeps the electric contact between the central and outer conductors. An electric lead of solid wire type 146 is attached to the closed end of the central conductor 140.

The membrane assembly 130 is installed in contact with the outer surface of the central conductor 140, covering a first furrow 142 that guides the flow of fluid through a first fluid path F1.

Referring to FIGS. 1 and 3, according to the present invention, the probe unit 100 may have a tube 120 with the inner surface engraved with a second furrow 122 for a second fluid path F2 at a position and area matching with the first furrow 142, placed adhesively to the outer surface of the membrane assembly 130. An inlet unit 124 for supplying the fluid and an outlet unit 125 for exhausting the fluid are installed at each end of the tube 120. The tube 120 is preferred to have a very big skin depth or be made of a nonmetallic material such as glass epoxy laminate in order to minimize distortion of the sensing magnetic field. The first and second furrows 142 and 122 are constructed to cover wider areas parallel to the central axis in order to make the more fluid exposed to the constant sensing magnetic field, and hence increasing NMR signal strength thereof. With this structure, the probe unit 100 generates a sensing magnetic field ($B_1$) with the flow of RF current between the central conductor 140 and the outer conductor 110. The strength of the sensing magnetic field in a space between the central and outer conductors is inversely proportional to a distance along a radial direction from the central conductor. The direction of the sensing magnetic field for NMR is orthogonal to the central axis of the central conductor 140. The central conductor 140 may be connected also with an external apparatus (e.g., a potentiostat). The fluids passing through the fluid furrows 142 and 122 are exposed to the sensing magnetic field. Therefore, it is possible to detect in situ and in real time, the variation of various characteristics due to chemical reactions and spatial redistribution of the chemical constituents of a fluid, by NMR.

Figure 4:
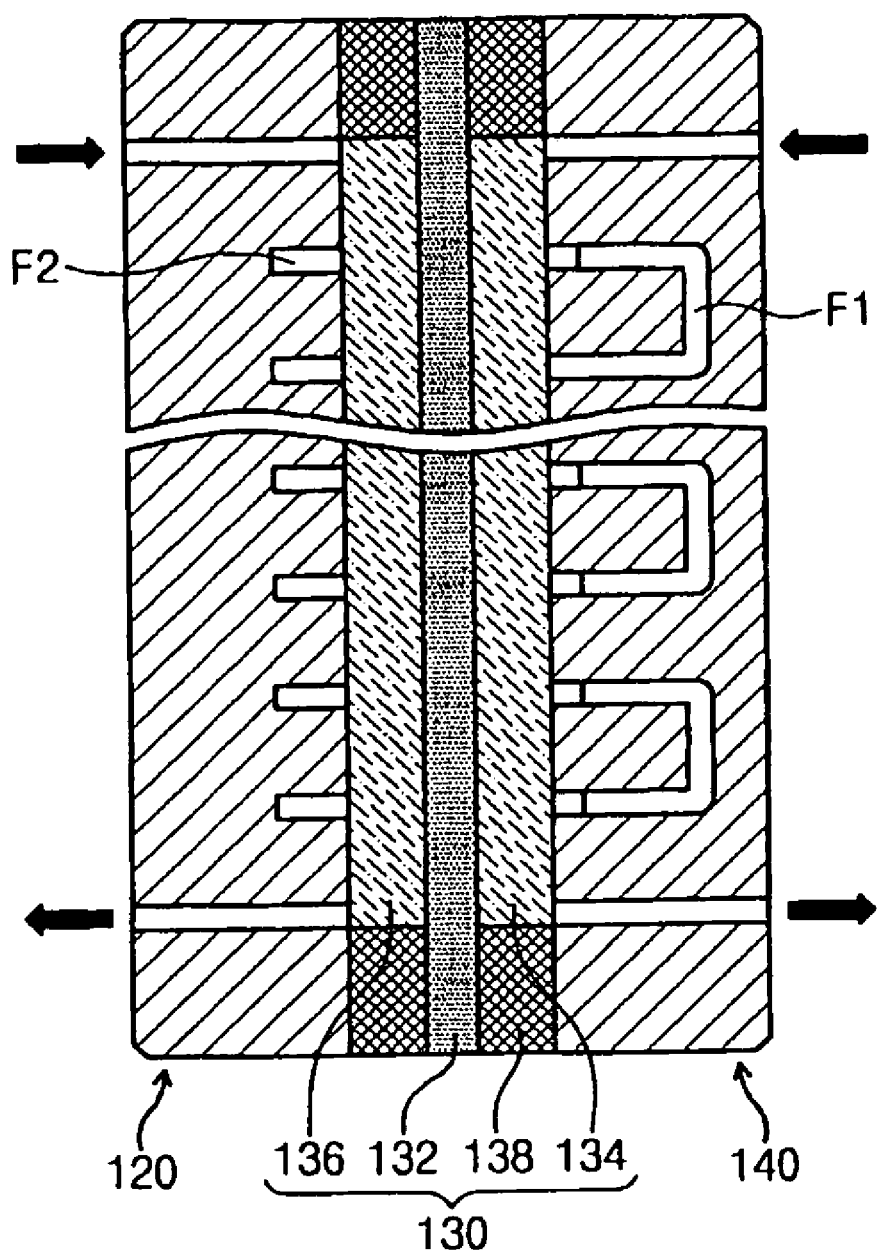
FIG. 4 is an enlarged sectional view of the part A in FIG. 1 including a membrane assembly according to the present invention.

FIG. 4 is an enlarged sectional view of the part A, including the membrane assembly 130. Referring to FIGS. 1 and 4, according to a modification of the present invention, the membrane assembly 130 may be prepared with an electrolyte membrane 132 of an electrochemical cell, an anode 134 and a cathode 136 that are attached each to the inner surface and outer surface of the membrane 132. In this structure, the fluids are forced to flow through the first and second furrows 142 and 122, in contact with the membrane 132. The anode 134 or the cathode 136 may be installed either the outer surface or the inner surface of the membrane 132.

The membrane assembly 130 may constitute a direct methanol fuel cell (DMFC), then, Fluid 1 (methanol) and Fluid 2 (oxygen gas) flow through the first and second fluid paths F1 and F2, respectively, or alternatively F2 and F1, depending on the disposition of the anode 134 and the cathode 136. The arrows in FIG. 4 represent flow directions of the fluids. The electrode 134 and/or 136 is made of a carbon cloth or paper and metallic catalysts coated on the surface of the carbon cloth or paper. The anode 134 on the inner surface of the membrane 132 is connected to an external apparatus by way of the central conductor 140, while the cathode 136 on the outer surface of the membrane 132 is connected to the external apparatus by way of a current collector which will be described later. The anode 134 and the cathode 136, at each side of the membrane 132, react with methanol and oxygen gas, respectively, which are supplied through the inner and outer fluid paths, F1 and F2, respectively, and generate a current passing through a current path (not shown) connected through the external apparatus. During this electrochemical reaction, methanol and oxygen gas may be transformed into other chemicals as shown in the following reaction formula. The probe unit is able to detect the reaction reagents, intermediates, and products, and their spatial distribution in real time and in situ.

Anode: $CH_3OH + H_2O = CO_2 + 6H^+ + 6e^-$

Cathode: $3/2 O_2 + 6H^+ + 6e^- = 3H_2O$

The membrane assembly 130 may have cylindrical gaskets 138 that are installed at both ends of the membrane assembly in order to block leakage of fluids flowing through the first and second fluid paths F1 and F2.

The probe unit 100 may be additionally comprised of the collector 160 interposed between the ends of the central and outer conductors 140 and 110 and connected to one of the electrodes of the membrane assembly 130. The collector 160 may electrically connect the cathode 136 to the external apparatus.

The present invention is not restrictive to the aforementioned chemical cell in application. Rather, for instance, the present invention also provides a technique capable of measuring fluid reaction and chemical redistribution across a membrane film under osmotic pressure, in real time, by properly modifying the configuration of the membrane assembly 130. Further, it is able to monitor real-time reaction of gas, which flows through a specific one of the fluid paths, by a metallic catalyst that is provided to the membrane assembly 130.

Meanwhile, the first and second fluid furrows 142 and 122 may be arranged in a form differently configured from the one winding orthogonal to the central axis of the central conductor 140. One of possible modifications is described in FIG. 5 according to the present invention. The same reference numerals as in FIGS. 1 through 3 may denote the same elements with the same functions but different in configuration.

Figure 5:
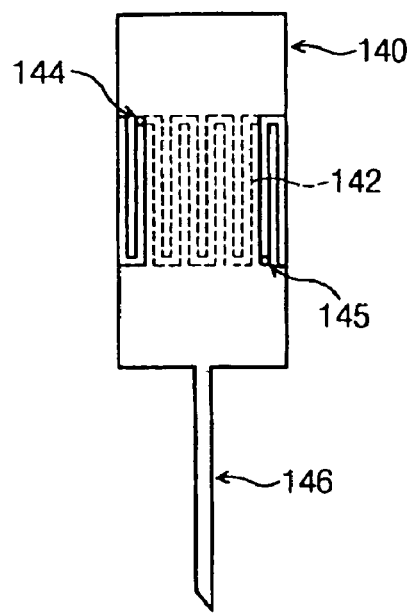
FIG. 5 is a sectional view illustrating a modified central conductor according to the present invention.
Figure 6A:
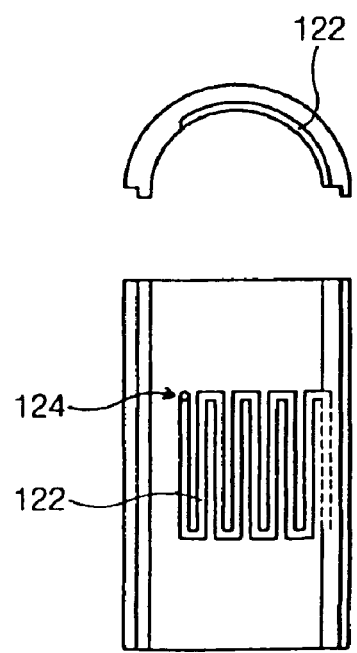
FIGS. 6A and 6B are sectional views of a tube for a modified central conductor according to the present invention.
Figure 6B:
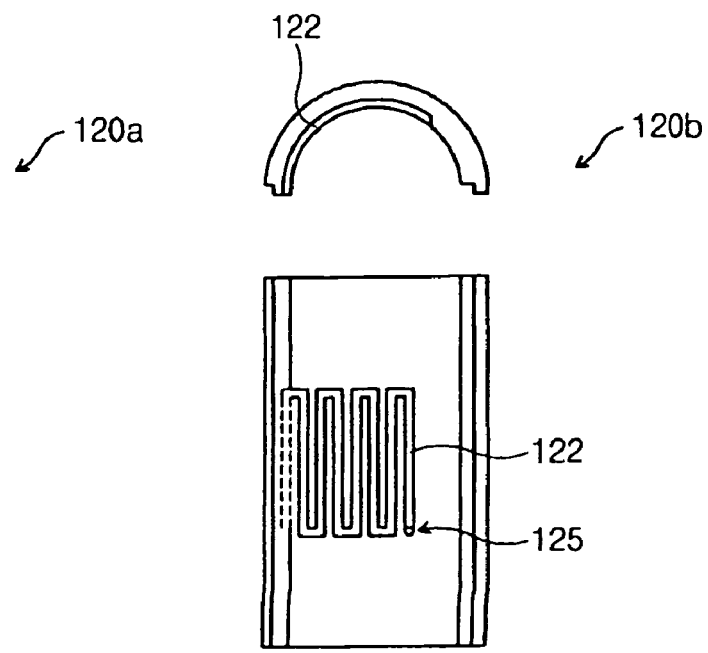

FIG. 5 is a sectional view illustrating a modified central conductor 140 according to the present invention. Referring to FIG. 5, the modified central conductor 140 is comprised of the first furrow 142, on the outer surface of the conductor, extending from one end toward the other end along the central axis. A fluid flows through the first furrow 142. In the central conductor 140, the inlet unit 144 is provided for supplying the fluid, and the outlet unit 145 is for exhausting the fluid. An electric lead of solid wire type 146 is attached to the closed end of the central conductor 140. FIGS. 6A and 6B illustrate assembly parts, 120a and 120b, of the tube 120 for the fluid flow through the outer furrow 122 according to modifications of the present invention, in which the upper illustrations show the top views while the lower illustrations show the side views. The parts, 120a and 120b, join with each other to form the tube 120. The tube 120 is comprised of the second furrow 122 on the inner surface at the position matching with the first furrow 142. The first and second furrows 142 and 122 are constructed to wind parallel to the central axis. The inlet unit 124 for supplying the fluid, and the outlet unit 125 for exhausting the fluid are installed in the tube 120.

Meanwhile, the first and second fluid paths may be formed by means different from furrows of the above specification. For example, the first fluid paths may be made with a film patterned and sandwiched between the central conductor and the membrane assembly. The second fluid paths may be made with a film patterned and sandwiched between the tube and the membrane assembly.

According to the present invention as aforementioned, it is possible to detect real-time and in situ chemical reactions occurring at the interface between fluid and solid, and spatial distribution variation of chemicals across the interface. Furthermore, it is able to detect reaction variations of a fluid when reaction environmental factors such as current, voltage, temperature, and flux are changed.

The above-disclosed subject matter is to be considered illustrative, not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A toroidal cavity nuclear magnetic resonance probe unit comprising:
   a cylindrical outer conductor including an opening at a first end to a central axis, and a hollow inside;
   a central conductor placed concentrically in the outer conductor;
   a membrane assembly disposed adhesively to the central conductor, and said membrane assembly interposed between the outer and central conductors;
   a first flow path, guiding a flow of fluid, extending from a first end of the central conductor toward a second end of the central conductor along the central axis, adjacent to a first side of the membrane assembly; and
   a cap connecting the first ends of the central and the outer conductor, wherein a sensing magnetic field is generated by applying a RF current between the outer and central conductors and wherein the probe unit is configured to enable real time and in situ detection of variations of characteristics as well as spatial distribution changes of a fluid passing through at least said first flow path and/or detect a chemical reaction in the membrane assembly, by nuclear magnetic resonance in real time and in situ.

2. The probe unit as set forth in claim 1, which further comprises a second flow path, guiding a flow of fluid, extending from the first end toward the second end of the central conductor along the central axis, adjacent to a second side of the membrane assembly.

3. The probe unit as set forth in claim 2, wherein the central conductor further comprises a first furrow extending from a first end of the outer surface of the central conductor towards a second end along the central axis, the first furrow constituting the first flow path.

4. The probe unit as set forth in claim 3, further comprising a tube including a second furrow on an inner surface of the tube at a position matching with the first furrow, the tube and the second furrow being disposed adhesively to an outer surface of the membrane assembly, the second furrow constituting a second flow path.

5. The probe unit as set forth in claim 4, wherein the first and second furrows are configured for winding in a direction which is at least one of parallel or orthogonal to the central axis.

6. The probe unit as set forth in claim 4, wherein the membrane assembly comprises a membrane of an electrochemical cell and the fluid flows in contact with the membrane.

7. The probe unit as set forth in claim 6, wherein the membrane assembly further comprises anode and cathode electrodes that are disposed on inner and outer surfaces of the membrane, respectively.

8. The probe unit as set forth in claim 7, wherein the electrodes comprise a carbon cloth, and metallic catalysts coated on the surface of the carbon cloth.

9. The probe unit as set forth in claim 8, wherein the membrane assembly further comprises cylindrical gaskets in order to block leakage of the fluid flowing through the first and second fluid paths.

10. The probe unit as set forth in claim 6, wherein at least one of methanol and oxygen gas flow in the first and second fluid paths.

11. The probe unit as set forth in claim 7, wherein the central conductor comprises:
   a cylinder with a hollow, wherein the first end of the central conductor is open and the second end of the central conductor is closed, and an electric lead is attached to the closed end of the cylinder,
   wherein the probe unit further comprises a collector disposed between the central conductor and the outer conductor and the collector being connected to one of the electrodes of the membrane assembly.

* * * * *